United States Patent [19]
Shimanuki et al.

[11] Patent Number: 5,900,059
[45] Date of Patent: May 4, 1999

[54] METHOD AND APPARATUS FOR FABRICATING SEMICONDUCTOR SINGLE CRYSTAL

[75] Inventors: Yoshiyuki Shimanuki; Toshimichi Kubota; Toshirou Kotooka; Makoto Kamogawa, all of Hiratsuka, Japan

[73] Assignee: Komatsu Electronic Metals Co., Ltd., Kanagawa, Japan

[21] Appl. No.: 09/059,770

[22] Filed: Apr. 14, 1998

Related U.S. Application Data

[63] Continuation-in-part of application No. 08/834,603, Apr. 7, 1997, abandoned.

[30] Foreign Application Priority Data

May 29, 1996 [JP] Japan ..................................... 8-157510

[51] Int. Cl.⁶ ................................................. C30B 35/00
[52] U.S. Cl. ........................... 117/217; 117/218; 117/222
[58] Field of Search ................................. 117/13, 31, 34, 117/201, 202, 213, 215, 216, 217, 218, 222

[56] References Cited

U.S. PATENT DOCUMENTS

| | | | |
|---|---|---|---|
| 4,957,713 | 9/1990 | Kravetsky et al. | 117/217 |
| 5,196,173 | 3/1993 | Aria et al. | 117/213 |
| 5,361,721 | 11/1994 | Takano et al. | 117/217 |
| 5,441,014 | 8/1995 | Tomioka et al. | 117/31 |
| 5,683,505 | 11/1997 | Kunamochi et al. | 117/31 |

FOREIGN PATENT DOCUMENTS

| | | | |
|---|---|---|---|
| 02097478 | 4/1990 | Japan . | |
| 3-279290 | 12/1991 | Japan | 117/217 |
| 06279169 | 10/1994 | Japan . | |
| 06287098 | 10/1994 | Japan . | |
| 2139918 | 11/1984 | United Kingdom | 117/217 |

*Primary Examiner*—Felisa Hiteshew
*Attorney, Agent, or Firm*—Welsh & Katz, Ltd.

[57] ABSTRACT

This invention provides a method and apparatus for fabricating semiconductor single crystals. By using the method of this invention, the temperature gradient of the single crystal being lifted can be easily controlled. The as-grown defect density can be reduced, and it is possible to manufacture high quality semiconductor single crystals with high oxidation-film breakdown strength. A shield cylinder is used for surrounding the semiconductor single crystal 7 being lifted, the shield cylinder is made to be of the telescopic type and consists of a first shield duct 4, a second shield duct 5, a third shield duct 6. A wire 8 wrapping around a wind-up reel 10 is engaged with the third shield duct 6, and the shield cylinder can be driven to extend or retract by rotating the wind-up reel 10. An ascend and descend rod 3 is connected with the first duct 4, and the shield cylinder can be driven to move upward or downward by lifting or lowering the ascend and descend rod 3. The wind-up reel 10 is driven to retract part of the shield cylinder so that the lapped portion of the shield cylinder keeps a predetermined portion of the semiconductor single crystal 7 being lifted warm, and the temperature gradient of the semiconductor single crystal 7 can be reduced when it passes through the zone whose temperature is within a range from 1000° C. to 1200° C.

5 Claims, 6 Drawing Sheets

| | time required (relative value) |
|---|---|
| conventional art | 1 |
| present invention | 0.6 |

Fig. 10

METHOD AND APPARATUS FOR FABRICATING SEMICONDUCTOR SINGLE CRYSTAL

CROSS-REFERENCE TO RELATED APPLICATIONS

This is a continuation-in-part of U.S. application Ser. No. 08/834,603, filed Apr. 7, 1997, now abandoned and the benefit of filing date of which is herein claimed still pending.

BACKGROUND OF THE INVENTION

FIELD OF THE INVENTION

The present invention relates to a method and an apparatus for fabricating semiconductor single crystals by using the Czochralski Method (the CZ method).

Figure 8:
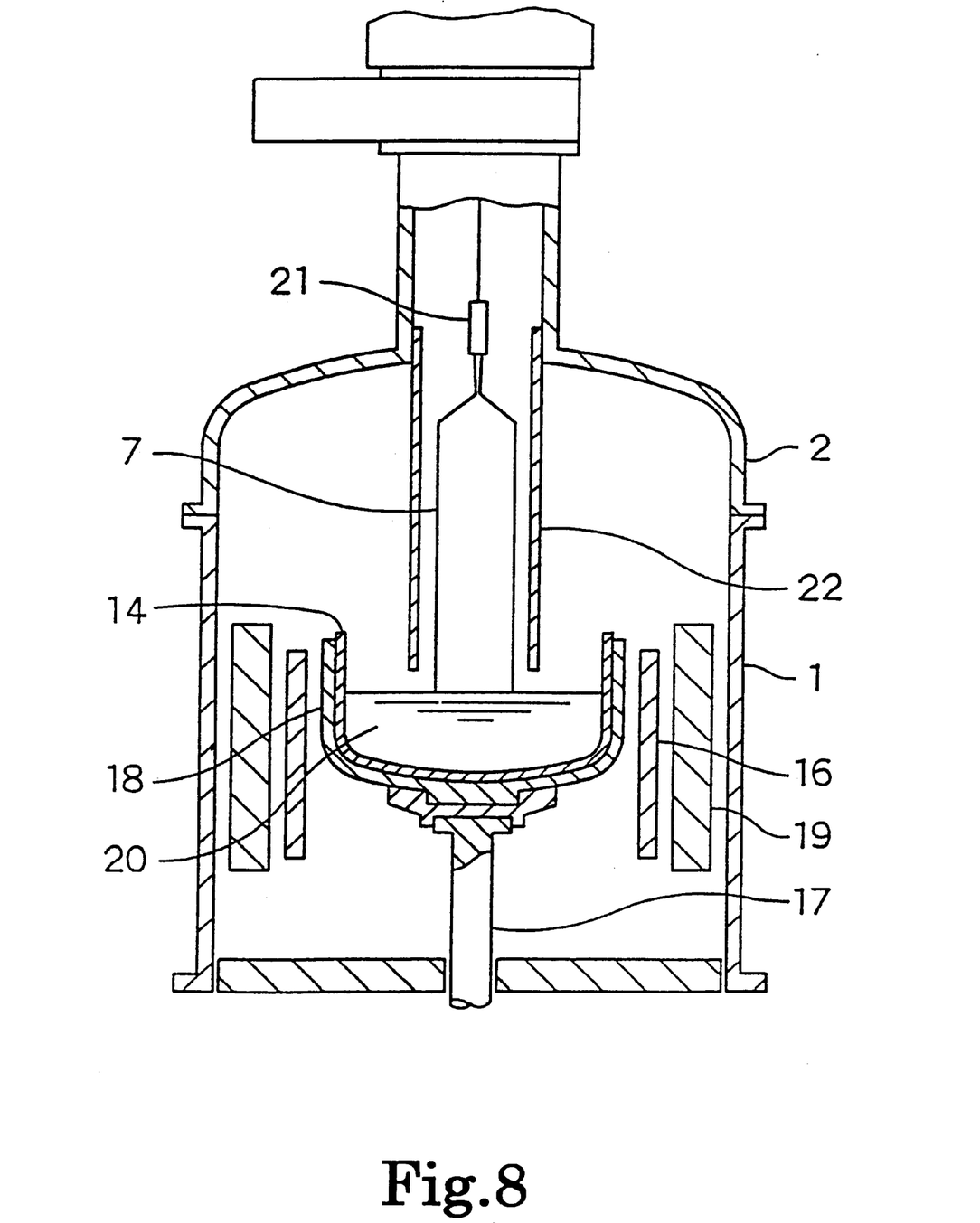
FIG. 8 is a cross sectional view showing one example of conventional semiconductor single crystal fabricating apparatuses.

At present, most semiconductor substrates used for fabricating semiconductor components are single crystals of silicon with high purity. FIG. 8 is a cross-sectional diagram showing a semiconductor single crystal fabricating apparatus provided with a shield cylinder surrounding the semiconductor single crystal being lifted. As shown in FIG. 8, within the main chamber 1, a graphite crucible 18 is disposed upon the upper end of a rotary crucible shaft 17 which is able to be driven to extend upward or downward. A cylindrical heater 16 and a keep-warm cylinder 19 are disposed around the crucible 18.

Polycrystalline silicon in lumps is put into a quartz crucible 14 which is accommodated within the graphite crucible 18, then the polycrystalline silicon is heated by the heater 16 to be melted into a melt 20. A seed crystal in a seed holder 21 is immersed into the melt 20, and thereafter the seed holder 21 is slowly withdrawn and rotated in a direction the same as or counter to that of the rotation of the graphite crucible 18 to grow a single crystal silicon 7.

A graphite shield cylinder 22 is suspended and extended to above the melt 20 within an upper chamber 2 which is connected to the main chamber 1. The graphite shield cylinder 22 is engaged with an ascent and descent mechanism (not shown) so as to perform an upward or a downward movement when intended. The graphite shield cylinder 22 controls the flow of inert gas coming from a source above the upper chamber 2 and obstructs heat radiation coming from heater 16 and melt 20. By this arrangement, the single crystal silicon 7 being lifted can be cooled or kept warm throughout the whole temperature zone, thereby expediting the crystallization and accordingly enhancing the productivity of the single crystal silicon 7.

The heat radiation coming from the parts within a hot zone (for example, the heater 16) toward the single crystal silicon 7 being lifted is obstructed by the graphite shield cylinder 22, thus the temperature gradients both in radial and axial directions near the solid/liquid boundary of the single crystal silicon 7 become large, and this leads to a easy crystallization of the single crystal silicon 7. In view of the above, it is possible to accelerate the lifting speed of the single crystal silicon 7, and the productivity can thus be enhanced. However, it is impossible to alter the thickness of the shield cylinder 22 in response to the surrounding circumstances within the heating furnace, nor is it possible to adjust the execution of cooling or heat obstruction at a designated portion of the single crystal silicon 7 being lifted. Therefore, the following disadvantages will happen:

(a) When the single crystal silicon 7 passes through the zone whose temperature is within a range between 1000° C. and 1200° C., it can not be cooled slowly. As a result, the as-grown defect density can not be reduced sufficiently. This will reduce the oxidation-film breakdown strength.

(b) In the operation of melting polycrystalline silicon in the quartz crucible 14, an ascent and descent mechanism is used to lift the upper portion of the shield cylinder 22 so as to accommodate it within the upper chamber 2. By this, interference between the lower end of the shield cylinder 22 and the polycrystalline silicon can be avoided. For this purpose, an accommodation space is required in the upper chamber 2, and the total height of the upper chamber 2 is thus increased.

SUMMARY OF THE INVENTION

The object of the present invention is to provide a semiconductor single crystal fabricating apparatus in which a shield cylinder is utilized to surround a semiconductor single crystal being lifted by the Czochralski Method of fabricating semiconductor single crystals. The shield cylinder can be driven to move upward and downward, or to extend and retract in a telescopic manner at its own discretion.

Specifically, in the above-mentioned semiconductor single crystal fabricating apparatus, the shield cylinder is divided into a plurality of telescopic ducts which can be driven to move relative to each other in a telescopic manner. A wire winding around a wind-up reel is engaged with the innermost telescopic duct and an up-down rod is connected to the outermost telescopic duct, the shield cylinder is thus able to be driven to extend or retract by way of the windup reel and able to be driven to move upward or downward in response to the upward or downward movement of the up-down rod.

Furthermore, the method for fabricating semiconductor single crystals according to this invention is characterized in that : in the semiconductor single crystal fabricating apparatus, the wind-up reel can actuate the telescopic ducts of the shield cylinder to retract, and accordingly to lap one over another. By this, a designated portion of the semiconductor single crystal being lifted can be kept warm by the lapped telescopic ducts surrounding thereof, and the temperature gradient can thus be reduced when the semiconductor single crystal passes through the zone whose temperature is within a range from 1000° C. to 1200°C.

This invention relates a method and a apparatus for fabricating semiconductor single crystals by using the CZ method, in which the heat history of semiconductor single crystals can be easily controlled by a shield cylinder. In the apparatus for fabricating semiconductor single crystals, the shield cylinder is designed to surround the semiconductor single crystal being lifted, and the shield cylinder is able to be driven to move in a telescopic manner and to move upward or downward integrally so as to surround any portion of the semiconductor single crystal being lifted with determined thickness at its own discretion. Therefore, the heat history of the semiconductor single crystals can be controlled.

Specifically, the shield cylinder is of a telescopic type, and a wire winding around a wind-up reel is engaged with the most inner ducts of the shield cylinder. By this arrangement, the shield cylinder extends if the wind-up reel releases the wire, and the shield cylinder retracts if the wind-up reel winds up the wire. As a result, the thickness in the radial direction of the shield cylinder can be adjusted. Furthermore, the shield cylinder can move up and down much more, due to the retracting movement of the shield cylinder.

In the operation of fabricating semiconductor single crystals by utilizing the apparatus according to this invention, the shield cylinder can be extended and therefore the semiconductor single crystal being lifted can be shielded to a much greater extent along its longitudinal axis. Furthermore, due to the fact that the shield cylinder can be retracted to any predetermined length and be moved to any expected height, any portion of the semiconductor single crystal being lifted can be kept warm at its own discretion. In addition, the portion to be kept warm can also be altered by taking its surrounding heat circumstance into consideration. Especially, during the body forming process, by driving the wind-up reel to retract the expected portion of the shield cylinder, the ducts of the shield cylinder become partly lapped, and the effect of keeping warm will be enhanced. Therefore, by moving the lapped portion of the shield cylinder to shield the portion whose temperature is within a range from 1000° C. to 1200°C., it is possible to reduce the temperature gradient of the semiconductor single crystal passing through the above temperature zone. Thus, the formation of as-grown defect will be depressed.

BRIEF DESCRIPTION OF THE DRAWINGS

The present invention can be more fully understood by reading the subsequent detailed description of embodiment with references made to the accompanying drawings. It should be noted that the parts having the structure as those mentioned in prior arts are given the same numeral references, and explanations of structures are omitted.

DETAILED DESCRIPTION OF THE PREFERRED EMBODIMENT

Figure 1:
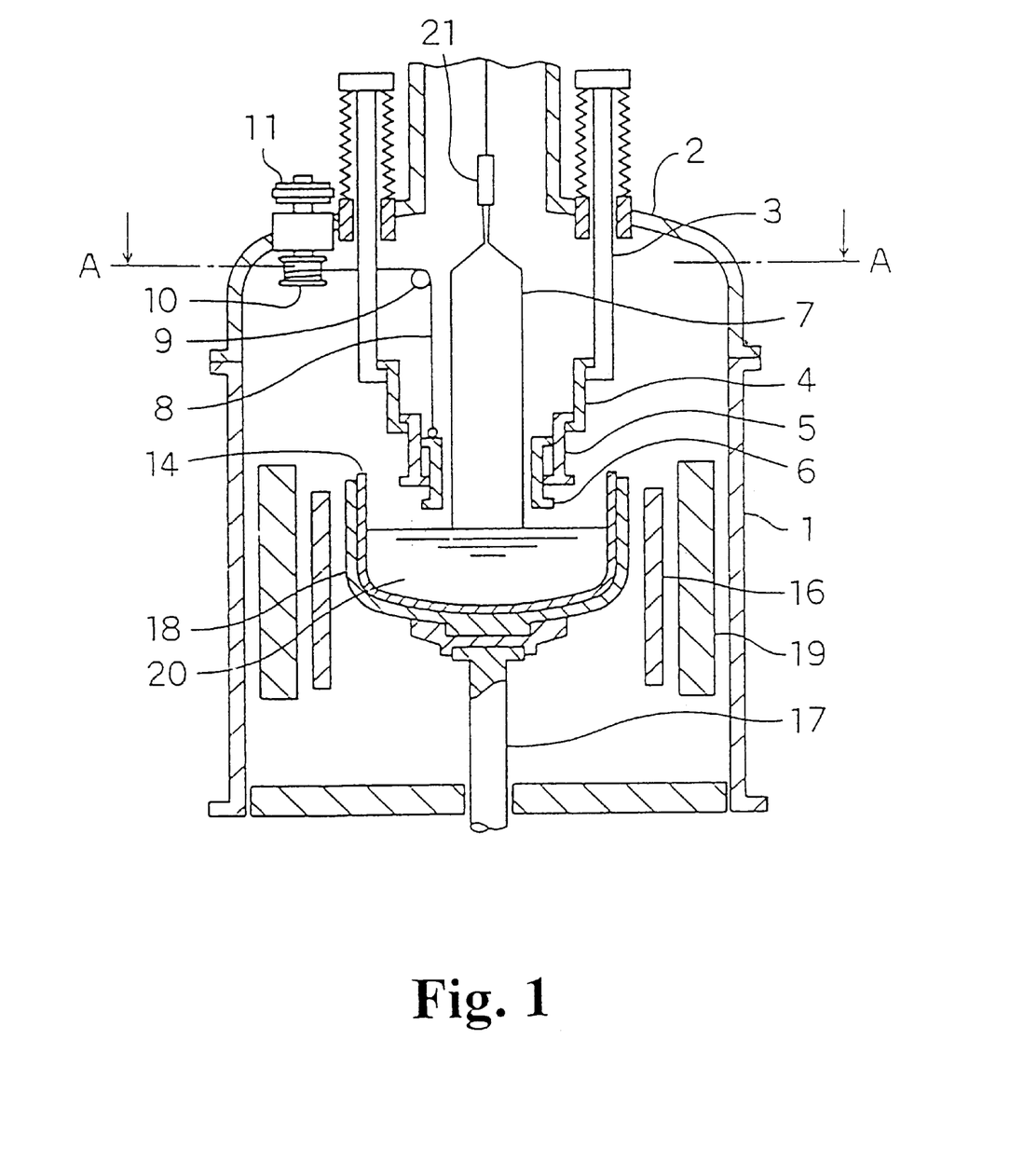
FIG. 1 is a simplified sectional diagram showing one embodiment of the semiconductor single crystal fabricating apparatus according to the present invention, and a shield cylinder in body forming process is shown therein.
Figure 2:
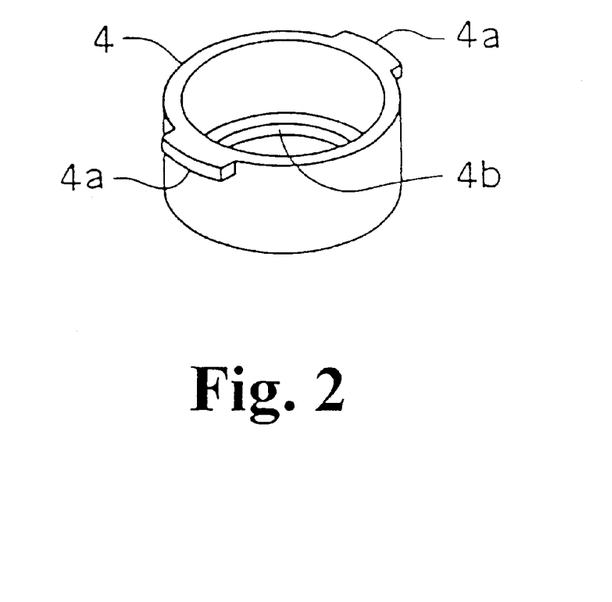
FIG. 2 is a perspective view showing the first shield duct.

FIG. 1 is a simplified sectional diagram showing one embodiment of the semiconductor single crystal fabricating apparatus according to the present invention. As shown in FIG. 1, an upper chamber 2 is installed upon the upper end portion of the main chamber 1, and two up-down rods 3 are disposed within the upper chamber 2 by means of an ascent and descent mechanism (not shown) . A first shield duct 4 is engaged with the lower end portions of the two up-down rods 3. As shown in FIG. 2, two protrusions 4a are provided on the upper peripheral rim of the first shield duct 4 and a flange 4b is formed on the inner peripheral wall of the lower end of the first shield duct 4. The first shield duct 4 is engaged with the up-down rods 3 by means of the two protrusions 4a. Flanges are provided respectively on the upper and lower ends of a second shield duct 5 which is disposed within the first shield duct 4 in a manner that it can slide without restraint, and a third shield duct 6 having flanges on its upper and lower ends is disposed within the second shield duct 5 in the same manner. The up-down rods 3, the first duct 4, the second duct 5, and the third duct 6 are made of graphite, graphite coated with SiC, or metals such as Mo. The combination of the above mentioned materials is also acceptable.

The third shield duct 6 is surrounding the single crystal silicon 7 with a predetermined gap between them. The upper end of the third shield duct 6 is engaging with a wire 8 which is wrapping around a wind-up reel 10 by way of a pulley 9. A pulley 11 being coaxial with the wind-up reel 10 is disposed above the upper chamber 2.

Figure 3:
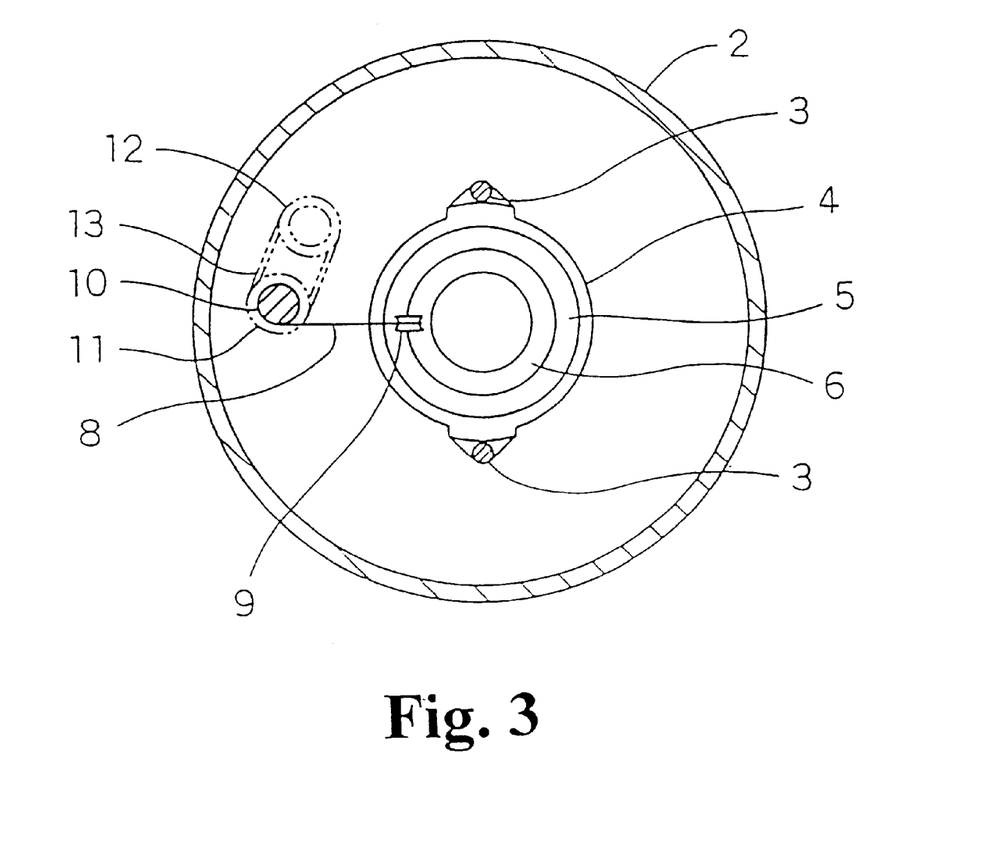
FIG. 3 is a cross sectional view along line A—A of FIG. 1.

FIG. 3 is a cross sectional view along line A—A of FIG. 1. For ease of description, in FIG. 1, the up-down rods 3, the wire 8, the pulley 9, and the wind-up reel 10 are depicted as being on the same plane. In fact, as shown in FIG. 3, the up-down rods 3 and the wire 8 are disposed perpendicular to each other. Therefore, they will not interfere with each other during operation. A pulley 12 connected with a motor (not shown) is installed above the upper chamber 2, the pulley 12 drives the pulley 11 and accordingly the wind-up reel 10 to rotate by way of a belt 13. Furthermore, in FIGS. 1 and 3, only one wire 8 is connecting with the third shield duct 6. However, this invention is not limited to such an arrangement, it is permissible if two or three wires 8 engage with the third duct 6 and each wire 8 wraps on a wind-up reel. It is also appropriate if the wind-up reel 10 is directly connected with the drive motor.

If the wind-up reel 10 is driven to wind up the wire 8, then the third shield duct 6 is at first lifted, subsequently the second shield duct 5 and the first shield duct 4 are lifted in order, and the shield ducts 4, 5, 6 become lapped with each other. If the wind-up reel 10 is driven to rotate to release the wire 8, then the third shield duct 6 and the second shield duct 5 will go down. After the upper end of the second shield duct 5 touches and engages with the lower end of the first shield duct 4, the third shield duct 6 continues to go down. The third shield duct 6 will stop going down when its upper end engages with the lower end of the second shield duct 5. Under such a circumstance, the shield cylinder extends to its maximum extent.

The following is the description of the processes of fabricating the semiconductor single crystal. The description is following the steps of fabricating processes.

(a) Material Melting Process

Figure 4:
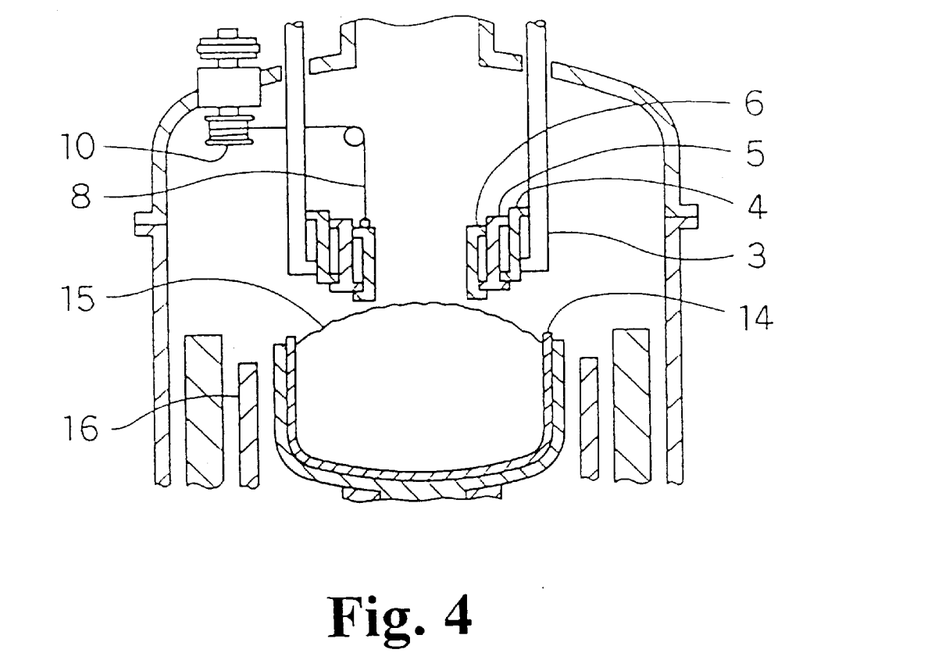
FIG. 4 is a cross sectional view showing the shape and the location of the shield cylinder during melting process.

As shown in FIG. 4, polycrystalline silicon 15 in lumps is put into a quartz crucible 14, then the polycrystalline silicon 15 is heated to be melted by the heater 16. At the same time, the wind-up reel 10 is driven to wind up the wire 8 to make the first duct 4, the second duct 5, and the third duct 6 lapped with each other. Then, the up-down rods 3 are driven to go down properly. By this, the shield ducts 4, 5, 6 can cover the polycrystalline silicon 15 and will not interfere with the polycrystalline silicon 15, and the quartz crucible 14 can be fixed and heated efficiently. The polycrystalline silicon 15 thus can be quickly melted into a melt.

(b) Shoulder Process

Figure 5:
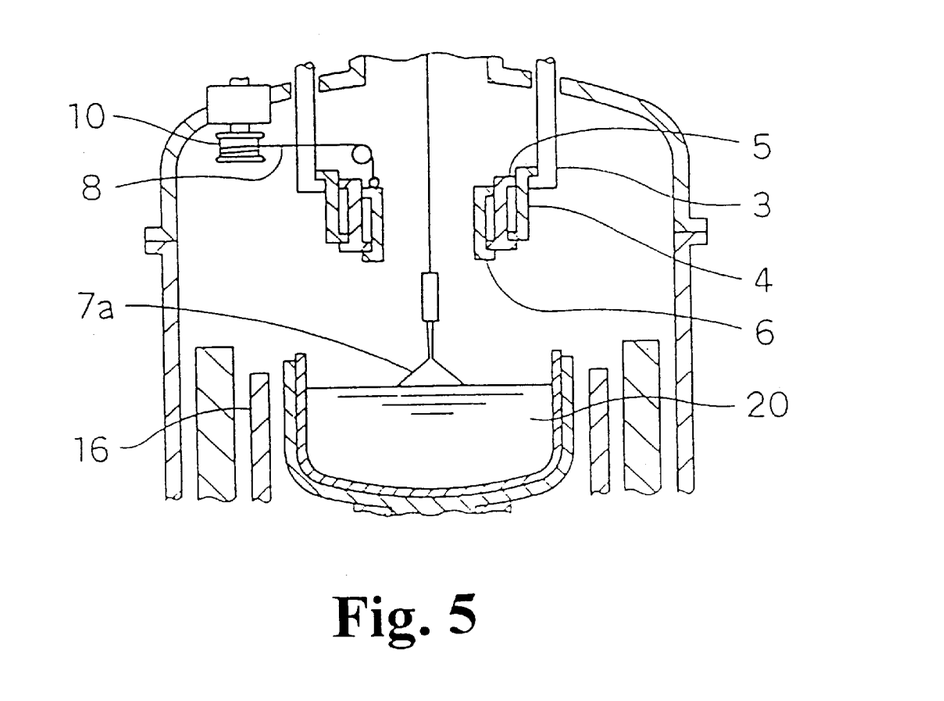
FIG. 5 is a cross sectional view showing the shape and the location of the shield cylinder during shoulder forming process or during disassembling some parts from the heating furnace.

As shown in FIG. 5, the shield ducts 4, 5, 6 are kept lapped and the up-down rods 3 are lifted to the utmost location. To effect the lifting of the up-down rods 3, the wind-up reel 10 is driven to wind up the wire 8. Under this circumstance, radiation from the heater 16 is not obstructed and directly reaches the shoulder 7a of the single crystal silicon.

(c) Body Process

Figure 6:
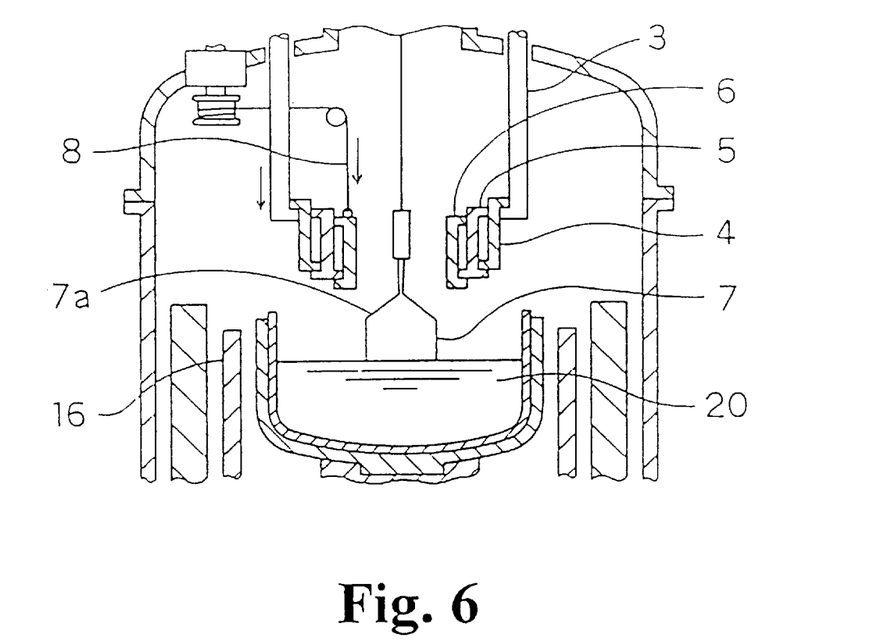
FIG. 6 is a cross sectional view showing the shape and the location of the shield cylinder at the beginning of body forming process.

At the beginning of the body process, just like the melting process, measures for preventing heat dissipation through the upper portion of the heating furnace are taken and heat radiation coming from heater 16 toward the single crystal silicon 7 is not obstructed. For this purpose, the shield ducts 4, 5, 6 are kept lapped (see FIG. 6). Under this circumstance, it is better to release the wire 8 to lower down the up-down rods 3 and move the shield ducts 4, 5, 6 to a location slightly higher than the shoulder 7a of the single crystal silicon 7.

The apparatus of the present invention comprises a shield cylinder having a plurality of telescopic ducts in order that the temperature gradient of the semiconductor single crystal can be reduced when it passes through the zone or region created when these ducts are lowered near the melt surface. The Temperature of this zone can thus be maintained within a range from 1000° C. to 1200° C.

By lowering the lapped portion of the shield cylinder near the melt surface, heat radiation from the melt to the semiconductor single crystal being pulled up is prevented and the crystal can be cooled more rapidly from its melting point to 1300° C. than by conventional methods. Thus the temperature gradient of the crystal can be magnified when it passes through the cooling zone which has a temperature within a range from the crystal melting point to 1300° C.

Figure 9:
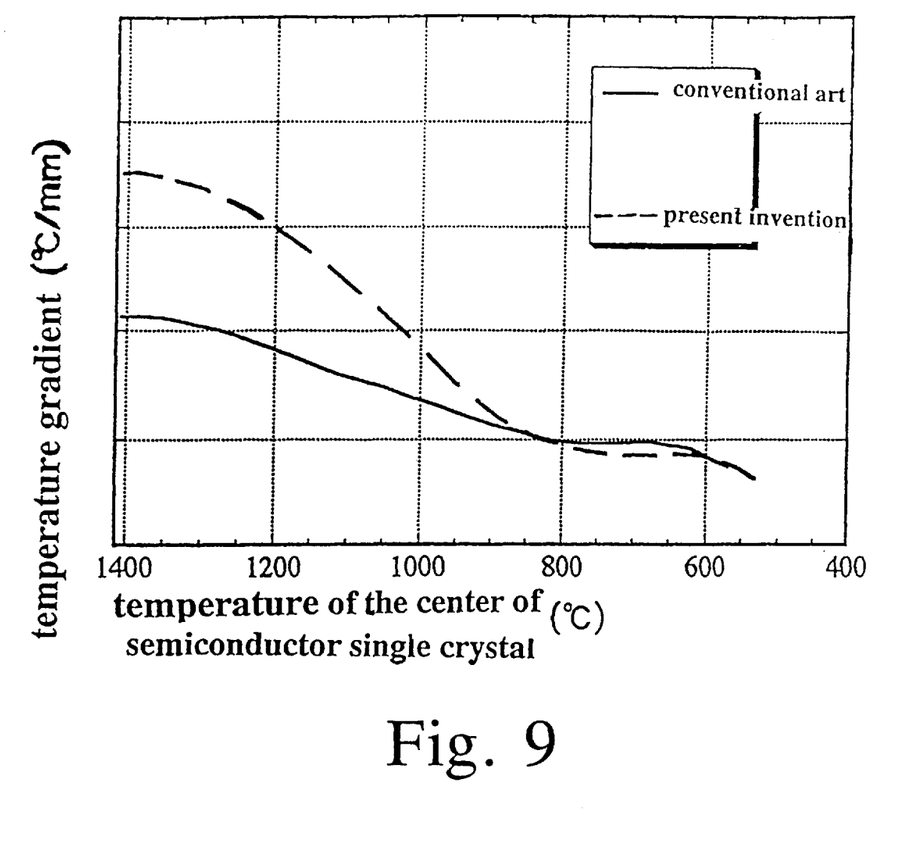
FIG. 9 is a graph of the temperature gradient of conventional methods and the method of the subject invention against the temperature of the crystal.
Figure 10:
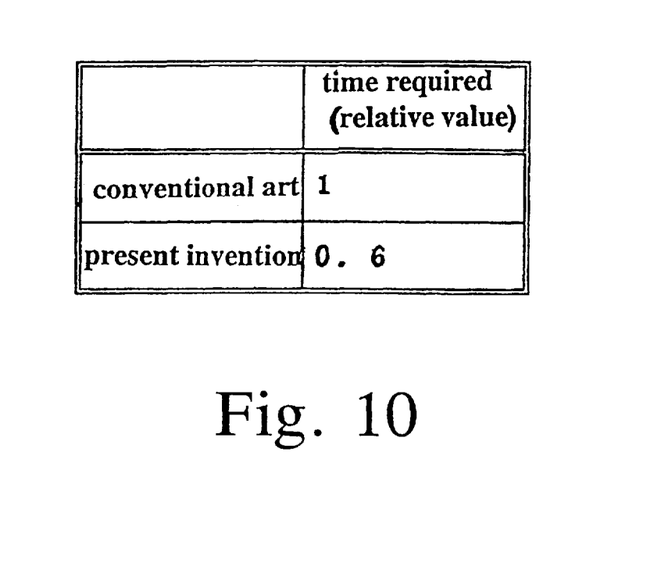
FIG. 10 is a chart showing the relative times necessary form a crystal.

As a result, as shown in FIGS. 9 and 10, the rate of pulling up is higher than that of the conventional method and higher productivity can be obtained. The method is especially effective at pulling up semiconductor single crystals having large diameters (larger than 8 inches) or a long length.

Following the growing of the single crystal silicon 7, the up-down rods 3 are lifted slowly. The first shield duct 4 rises following the lift of the up-down rods 3, and then the second shield duct 5 rises. However, the third shield duct 6 remains unmoved. Therefore, as shown in FIG. 1, the whole shield cylinder is extended, and the second shield duct 5 and the third shield duct 6 are lapped partly to form a cooling region. The lapped portion corresponds to a specified portion (in other words, the section having a temperature ranging from 1000° C. to 1200° C.) of the single crystal silicon 7. Being surrounded and insulated by the second shield duct 5 and the third shield duct 6, the specified portion can be cooled down slowly in the cooling region, and its temperature gradient is smaller than those of other portions.

(d) Tail Process and Cooling Process

Figure 7:
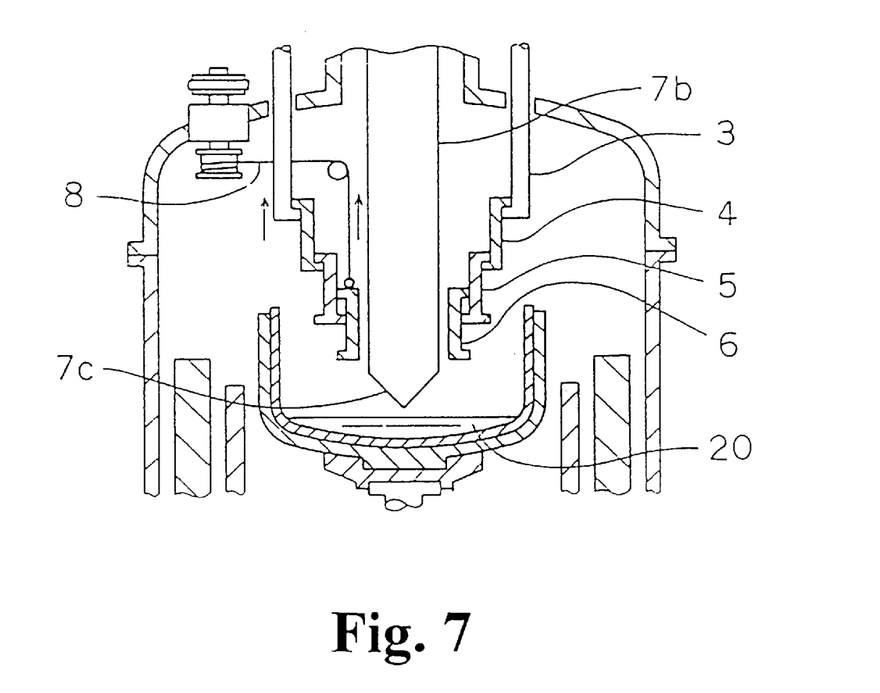
FIG. 7 is a cross sectional view showing the shape and the location of the shield cylinder during tail forming and cooling processes.

To form the tail 7c, the wire 8 is wound up and the up-down rods 3 are lifted slowly (see FIG. 7) after the temperature of the body 7b drops below 1000° C. Due to the fact that the body 7b is surrounded by the shield ducts 4, 5, 6 and heat radiation is obstructed, the body 7b is cooled down quickly. Following the lifting of the single crystal silicon 7, the shield ducts 4, 5, 6 are lifted to the utmost location of the up-down rods 3.

(e) Disassembling the Parts of the Furnace

After lifting the single crystal silicon, if disassembly of the parts of the furnace is desired, the wind-up reel 10 is driven to wind up the wire 8 to lift the up-down rods 3 to their highest location (same as shown in FIG. 5 of shoulder process). The disassembling operation will not be hindered by the shield ducts 4, 5, 6 and can be accomplished in a swift way.

As described above, the shield cylinder used for surrounding the semiconductor single crystal being lifted is made to be a telescopic type and can be driven to ascend or descend freely, the following effects can be obtained.

(a) By way of partly retracting the shield cylinder to lap over the shield ducts, the effect of keeping warm is enhanced, and the temperature gradient of the portion passing through will be thus reduced. By using the method of this invention to slowly cool the single crystal having a temperature ranging from 1200° C. to 1000° C., it becomes easy to reduce the as-grown defect density, and thus it is possible to manufacture high-quality semiconductor single crystals with high oxidation-film breakdown strength. Furthermore, by lifting or lowering the shield cylinder, it is possible to adjust the portion to be cooled down slowly in response to the surrounding heat circumstance.

(b) If the shield cylinder is retracted, the allowance for moving along its longitudinal direction will be enlarged. Therefore, in the processes of feeding material, forming the shoulder, and disassembling the parts, the operation will not be hindered if the shield cylinder is retracted. Furthermore, if the retracted shield cylinder is lowered to a location near the top of the fed polycrystalline silicon lump, the time needed to melt the polycrystalline silicon can be reduced. In addition, electric power needed by the heater can be saved and the life time of the parts of the furnace also can be elongated.

What is claimed is:

1. A semiconductor single crystal fabrication apparatus using a Czochralski Method to produce semiconductor single crystals, in which a shield cylinder is provided for surrounding the semiconductor single crystal being lifted, wherein said shield cylinder is capable of raising and lowering and comprises a means for maintaining a region within said shield cylinder within a temperature of 1000° C.–1200° C. through insulation of said region.

2. A semiconductor single crystal fabricating apparatus as claimed in claim 1, wherein the shield cylinder comprises a plurality of telescopic ducts, a wire wrapping around a wind-up reel being engaged with an innermost duct of the shield cylinder and a raising and lowering rod is connected with an outermost duct of the shield cylinder, the shield cylinder being driven to extend or retract by rotating the wind-up reel and driven to move upward or downward by raising or lowering the ascend and descend rod.

3. A method for fabricating semiconductor single crystals, in which a Czochralski Method is used, a shield cylinder being provided for surrounding the semiconductor single crystal being lifted, the shielded cylinder consisting of a plurality of telescopic ducts, a wire wrapping round a wind-up reel being engaged with an innermost duct of the shield cylinder and a raising and lowering rod being connected with an outermost duct of the shield cylinder, the shield cylinder being driven to telescopically extend or retract by rotating the wind-up reel and driven to move upward or downward by raising or lowering the raising and lowering rod, characterized in that: the wind-up reel telescopically reacts the shield cylinder so that the shield cylinder comprises a means for maintaining the temperature gradient of the semiconductor single crystal temperature within a range from 1000° C. to 1200° C.

4. A method of fabricating a semiconductor single crystal by using the apparatus according to claim 2, comprising the step of:

driving the wind-up reel to telescopically retract the shield cylinder and the shield cylinder is lowered near the melt surface to create a zone and to keep a portion of the semiconductor single crystal being pulled up cool, wherein the temperature gradient of the semiconductor single crystal can be magnified when it passes through the zone whose temperature is within a range from melting point to 1300° C.

5. A method of fabricating a semiconducted single crystal according to claim 3, comprising the step of:

driving the wind-up reel to telescopically retract the shield cylinder and the shield cylinder is lowered near the melt surface to create a zone and to keep a portion of the semiconductor single crystal being pulled up cool, whereby the temperature gradient of the semiconductor single crystal can be magnified when it passes through the zone whose temperature is within a range from melting point to 1300° C.

* * * * *